United States Patent Office 3,474,718

Patented Oct. 28, 1969

3,474,718

PHOTOSENSITIVE METHOD FOR DEPOSITING THIN UNIFORM GLASS FILMS ON SUBSTRATES

Joseph E. Guthrie and Seymour Merrin, Wilton, Conn., assignors to Sperry Rand Corporation, a corporation of Delaware No Drawing. Filed Feb. 8, 1966, Ser. No. 525,829
Int. Cl. G03c *5/24, 7/30, 11/24*
U.S. Cl. 96—34 1 Claim

ABSTRACT OF THE DISCLOSURE

A method for preferentially depositing a uniform layer of encapsulating glass on a substrate which includes preparing a photosensitive fluid within which glass particles having sizes in the range of about .01 to about 2 microns are suspended, coating a predetermined surface of the substrate with the fluid suspension, photographically developing the fluid suspension on predetermined areas of the surface where electrical connections are not to be established, baking the device to remove the residual coating of photodeveloped material, and then firing the device to cause glazing of the glass particles.

The present invention generally relates to methods for preferentially depositing glass films on substrates, and, more particularly, concerns a photosensitive method especially designed for the deposition of uniform pinhole-free layers of glass having a thickness of the order of microns.

One of the problems remaining to be solved in the fabrication of semiconductor devices is the tendency of the finished devices to vary in electrical characteristics as a function of time. It is believed that a substantial reduction in such variation can be achieved by encapsulation which effectively isolates the semiconductor device from contaminating environment. Attention has been concentrated recently on the use of glass as the encapsulating material. It has been found, however, that it is no easy matter to deposit glass in uniform layers of the order of microns in thickness on predetermined areas of a substrate.

One prior art technique attacks the problem of achieving thin uniform glass deposits on a substrate by placing glass particles in a suspending medium having a certain value of dielectric constant and then centrifuging the particles through the medium and on to a substrate. Uniformity of the deposited glass layer is achieved but not without the detracting requirement of centrifuging which substantially increases the fabrication cost of the ultimately desired encapsulated semiconductor devices. Another disadvantage of the aforementioned prior art process results from the need for aperturing the deposited glass layer in order to provide access to the underlying semiconductor device for establishing electrical connections. Aperturing is accomplished by chemical etching which, at the state of the art, is a marginal process.

One object of the present invention is to provide a method for depositing a thin uniform layer of glass on a substrate without requiring centrifuging.

Another object is to provide a method for depositing a thin uniform layer of glass on predetermined areas of a substrate without requiring etching of the glass.

A further object is to provide a method for depositing a uniform layer of glass of the order of microns in thickness on predetermined areas of a semiconductor device without requiring centrifuging or etching.

These and other objects of the present invention, as will appear from a reading of the following specification, are achieved in a typical embodiment of the invention by the provision of a method having as a first step the preparation of a photosensitive fluid for suspending glass particles having sizes in the range from about .01 to about 2 microns, said fluid having the characteristics of a dielectric constant in the range from about 1 to about 10, a viscosity in the range from about 5 to about 400 centipoise, and a surface tension in the range from about 10 to about 40 dynes per centimeter.

The method further provides for spin coating a substrate with the photosensitive fluid suspension and then removing the coating from predetermined areas of the substrate at which access through the coating to the substrate is desired. In a further step of the present method, the residual coating is removed from the substrate by baking at a temperature beneath that at which the suspended glass particles begin to glaze. Finally, the remaining glass particles are baked at a temperature sufficient to cause glazing thereby to yield a uniform thin glass layer on the substrate at predetermined locations as desired.

In accordance with the method of the present invention, the glass particles to be suspended in the photosensitive fluid are obtained by processing comercially available glass powder in a conventional manner. The glass powder, in addition to possessing characteristics suitable for encapsulation purposes, also should be substantially transparent to the spectrum of the radiation used to expose the photosensitive fluid. Type E1527 glass available from the B. F. Drakenfeld Company of Washington, Pennsylvania, is of suitable characteristics and transparency. The glass powder preferably is processed by standard ball milling and centrifuging operations to yield a size distribution of particles in the range from about .01 to about 2 microns.

After the aforesaid size distribution of glass particles is obtained, the particles are added to a photosensitive fluid such as a mixture of 60% by volume of a photosensitive resist sold under the trade name Kodak Thin Film Resist and 40% by volume of a photosensitive resist thinner sold under the trade name Kodak Ortho Resist Thinner. In a typical instance, .3 gram of the glass particles are added to the fluid mixture for each cubic centimeter of the mixture. The glass particles are placed in suspension in the fluid by standard homogenizing techniques such as by forcing the mixture of particles and fluid through a small orifice.

It has been found that best results, i.e., a thin uniform, pinhole-free glass deposit on the substrate, are achieved when the values of dielectric constant, viscosity and surface tension of the photosensitive fluid are within certain specified ranges. In general, to the extent that the dielectric constant of the glass differs from the dielectric constant of the fluid in which it is suspended, a tendency exists for the glass particles to group together and settle out of solution. The tendency, however, can be controlled by increasing the viscosity and/or surface tension of the fluid. Consequently, the present invention contemplates a wide range of fluid suspensions in which varying differences between the values of the dielectric constant of the glass and the dielectric constant of the fluid are compensated for by appropriate values of the viscosity and surface tension. Each of the fluid suspensions is characterized by a substantially uniform distribution of the glass particles whereby the desired uniformity of glass deposit is ultimately achieved on the substrate. All species of glass suspensions within the purview of the present invention are manifested by a photosensitive fluid having the characteristics of a dielectric constant in the range from about 1 to about 10, a viscosity in the range of about 5 to about 400 centipoises and a surface tension in the range from about 10 to about 40 dynes per centimeter.

The glass particle suspension preferably is applied to a substrate by means of a technique known as whirl or spin coating. The substrate, for example, a semiconductor device is placed on a horizontal vacuum chuck and spun about a vertical axis while the glass particle suspension is dropped on the substrate. The thickness of the resulting coating on the substrate is determined to a major extent by the viscosity and surface tension of the suspension and to a lesser extent by the velocity with which the substrate is spun. The length of time that the spinning is continued has no significant effect on the thickness of the coating. The deposited coating is sensitized by conventional photographic techniques in these areas where a glass deposit is desired on the substrate. Briefly, a mask is prepared having opaque areas where no glass is desired on the substrate and transparent areas where glass deposits are wanted. The photosensitive coating is exposed by light passing through the mask and is then developed to leave a coating residue containing the uniformly distributed glass particles in the desired areas only.

The photodeveloped residual coating is removed without disturbing the glass particle distribution by placing the substrate in an oven evacuated to a pressure of from about 20 to about 100 microns and heated at a rate of approximately 6° C./min. to about 450° C. The temperature is maintained at about 450° C. for a period of about 15 hours. Then, the oven temperature is dropped to 350° C. and the oven is flushed with oxygen at one atmosphere pressure for a period of about 15 minutes. The oxygen atmosphere quickly completes the removal of any sensitized fluid that might still be present at the end of the first baking operation.

The two baking operations remove the photodeveloped material and leave the glass particles on the substrate in substantially the same distribution that had existed in the fluid. The substrate with its preferential deposits of glass in the desired areas only is fired at a temperature sufficient to cause glass particles to form a glaze and to adhere to the substrate surface. In the case of the Type E1527 glass previously mentioned, the glazing temperature is about 570 degrees centigrade.

What is claimed is:

1. A method for preferentially depositing a uniform layer of glass having a thickness of the order of microns on a semiconductor device comprising the steps of preparing a photosensitive fluid within which glass particles having sizes in the range from about .01 to about 2 microns are suspended, said fluid suspension having the characteristics of a dielectric constant in the range from about 1 to about 10, a viscosity in the range from about 5 to about 400 centipoises and a surface tension in the range from about 10 to about 40 dynes per centimeter, coating a surface of said device with said fluid, photographically exposing and developing a photosensitive coating on predetermined areas of said device at which electrical connections are not to be established, removing a portion of the photodeveloped material from said predetermined areas by heating said device at a pressure of from about 20 to about 100 microns and at a rate of about 6° C./min. to about 450° C., flushing said areas at a temperature about 350° C. in an oxidizing atmosphere for about 15 minutes, and firing said device at a temperature sufficient to cause said glass particles to form a uniform glaze.

References Cited

UNITED STATES PATENTS

| | | | |
|---|---|---|---|
| 2,744,034 | 5/1956 | Dalton et al. | 117—97 |
| 3,114,065 | 12/1963 | Kaplan | 117—33.5 |
| 2,732,297 | 1/1956 | Minsk et al. | 96—34 |
| 2,900,255 | 8/1959 | Charlton | 96—34 |
| 3,212,921 | 10/1965 | Pliskin et al. | 117—201 XR |
| 3,222,173 | 12/1965 | Belko et al. | 96—34 XR |
| 3,300,339 | 1/1967 | Perri et al. | 117—201 XR |
| 3,355,291 | 11/1967 | Baird et al. | 97—27 |

OTHER REFERENCES

Kodak Photosensitive Resists for Industry, Kodak Industrial Data Book P–7. 1st edition, second 1964 printing, pp. 4, 5, 17, S–4 and S–5.

DAVID KLEIN, Primary Examiner

U.S. Cl. X.R.

29—588, 627; 96—38.4; 117—8, 33.5, 212